(12) United States Patent
Raiteri

(10) Patent No.: US 6,283,681 B1
(45) Date of Patent: Sep. 4, 2001

(54) METHOD AND DEVICE FOR ALIGNING A WORKPIECE ON A MACHINE TOOL TABLE

(76) Inventor: Angelo Raiteri, 10015 Ivrea, Italy via Soana, 6 Y (IT)

( * ) Notice: Subject to any disclaimer, the term of this patent is extended or adjusted under 35 U.S.C. 154(b) by 0 days.

(21) Appl. No.: 09/580,304

(22) Filed: May 26, 2000

Related U.S. Application Data

(62) Division of application No. 09/193,279, filed on Sep. 17, 1998, now Pat. No. 6,109,840.

(30) Foreign Application Priority Data

Nov. 18, 1997 (IT) .............................................. TO97A1010
May 29, 1998 (IT) .............................................. TO98A0463

(51) Int. Cl.⁷ ................................................... B23B 35/00
(52) U.S. Cl. ............................. 408/1 R; 408/3; 409/131; 700/192
(58) Field of Search .................... 408/1 R, 3, 16, 408/61, 91; 700/192, 193; 269/73, 309, 329; 83/412; 409/174, 131–133

(56) References Cited

U.S. PATENT DOCUMENTS

| | | | |
|---|---|---|---|
| 4,610,442 | * 9/1986 | Oku et al. | .................. 269/73 |
| 4,786,216 | * 11/1988 | Kitagawa et al. | ..................... 408/69 |
| 5,109,584 | * 5/1992 | Irie et al. | ................................ 408/69 |
| 5,111,406 | * 5/1992 | Zachman et al. | ....................... 408/16 |
| 5,154,546 | * 10/1992 | Neumann et al. | .................... 408/1 R |
| 5,246,316 | * 9/1993 | Smith | .................................... 408/1 R |
| 5,354,153 | * 10/1994 | Ottone et al. | .......................... 408/1 R |
| 5,529,441 | * 6/1996 | Kosmowski et al. | ................ 408/1 R |
| 5,660,381 | * 8/1997 | Suzuki | .................................... 269/73 |
| 5,711,641 | * 1/1998 | Piovano | ............................. 408/1 R |
| 6,109,840 | * 8/2000 | Raiteri | ..................................... 408/3 |

* cited by examiner

Primary Examiner—Steven C. Bishop
(74) Attorney, Agent, or Firm—Sheridan Ross P.C.

(57) ABSTRACT

The workpiece or pack of printed circuit boards is fitted to a clamping fixture carried by the table and is machined by a machining head; the head and the table being movable with respect to each other along two coordinate X, Y axes. The aligning method includes the steps of providing the pack with two locating holes; fitting the pack to the fixture; determining the distances between the real positions of the holes and two reference positions; and moving the pack on the fixture to eliminate the distances. The aligning device has an optoelectronic sensor carried by the head to determine the real position of each hole; and a number of motors controlled on the basis of the real position of each hole to move a locating member for locating a first pin on the pack, and to move one bar of a pair of bars for clamping the other pin on the pack.

7 Claims, 7 Drawing Sheets

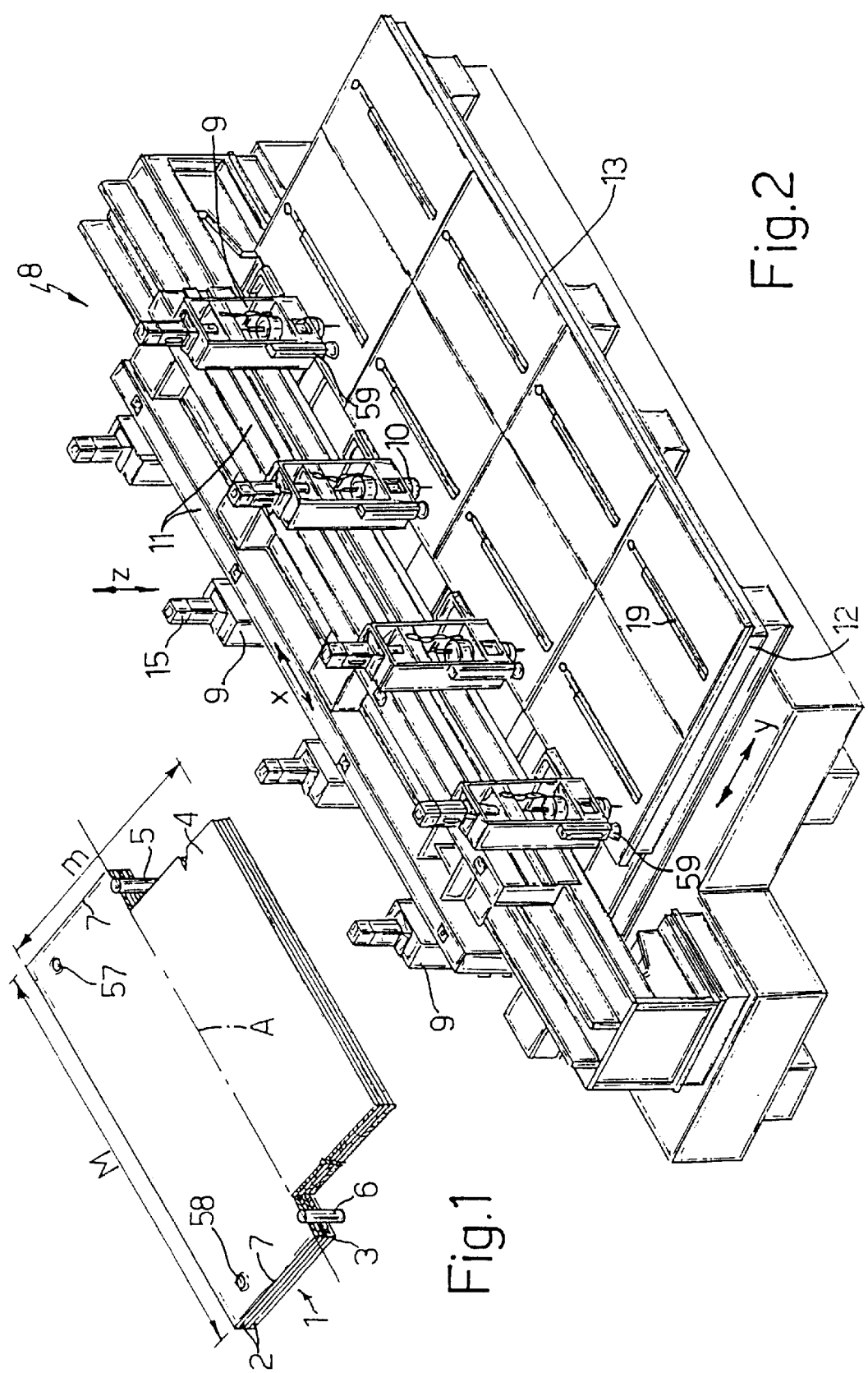

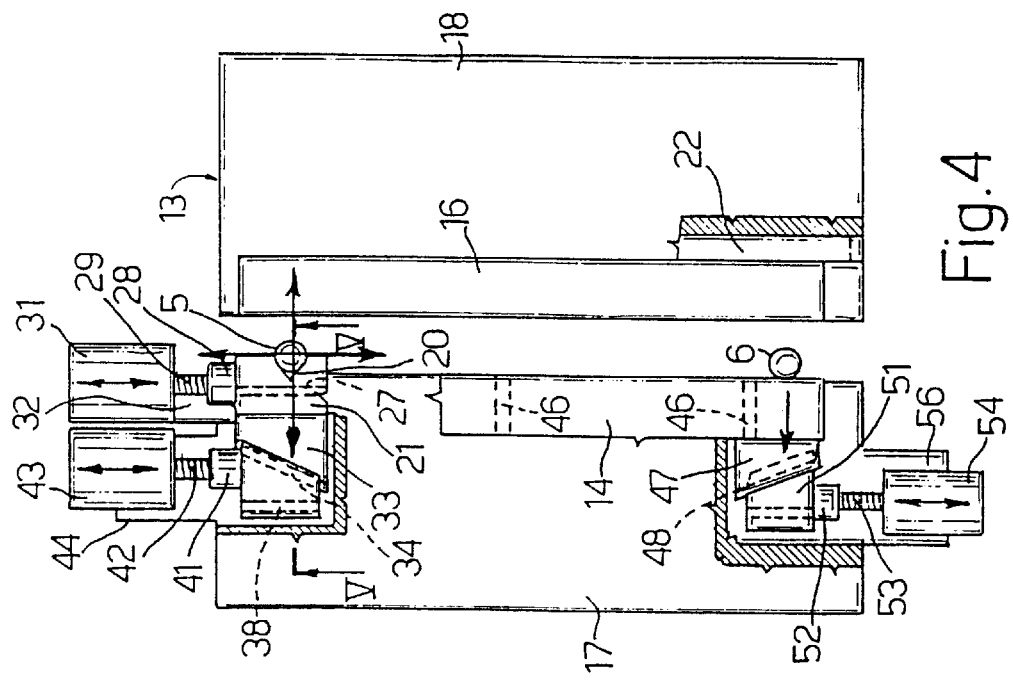
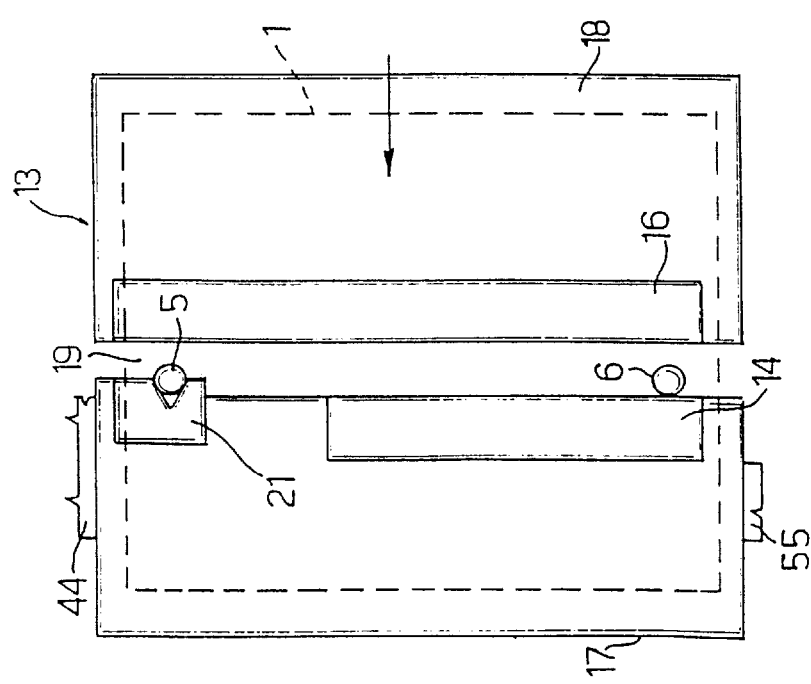
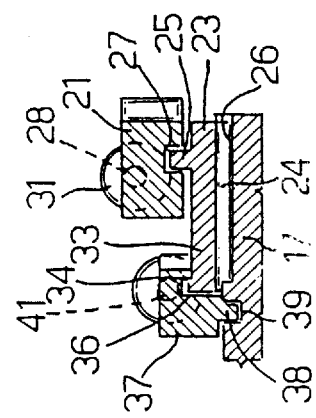

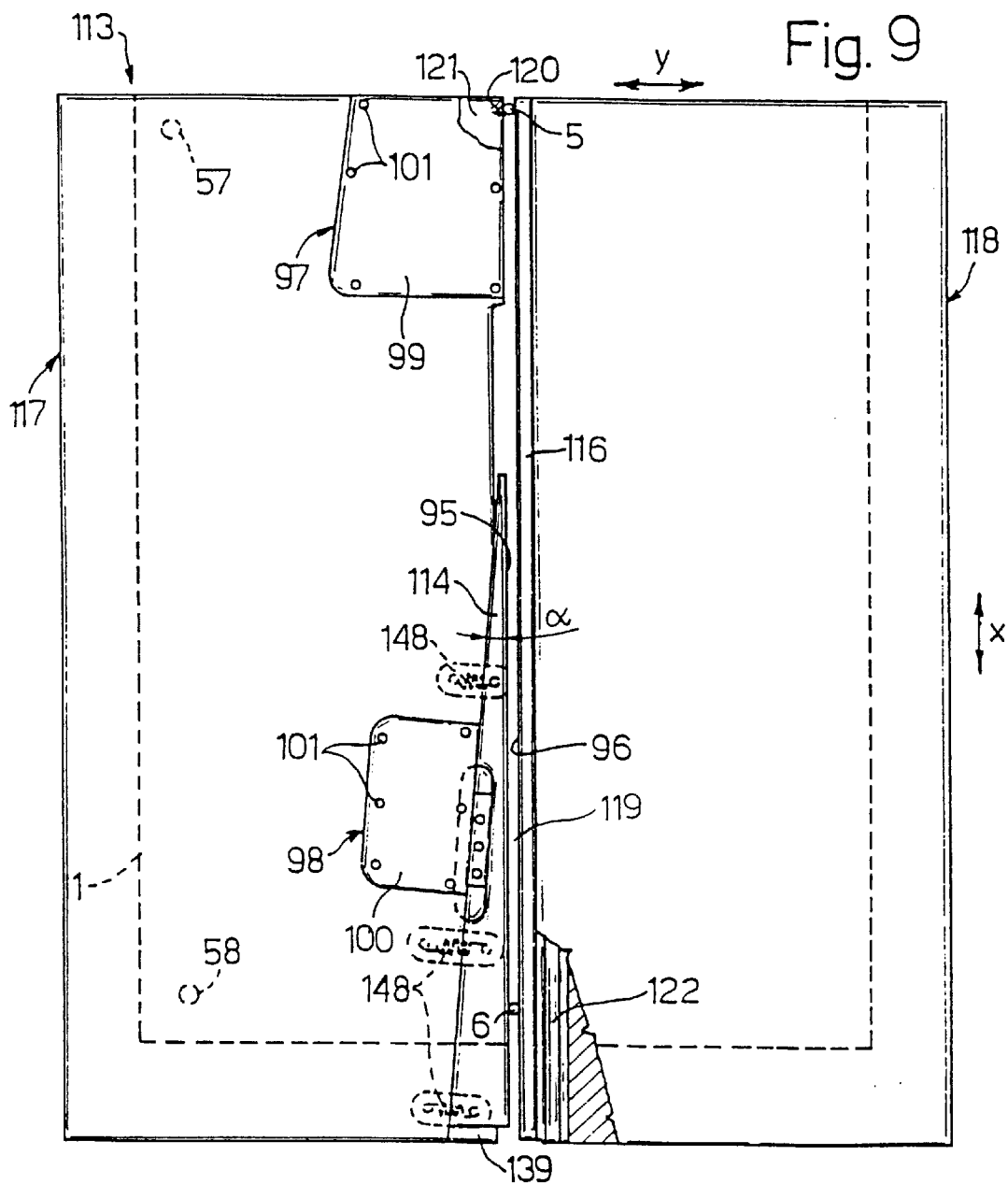

METHOD AND DEVICE FOR ALIGNING A WORKPIECE ON A MACHINE TOOL TABLE

CROSS REFERENCE TO RELATED APPLICATION

This is a divisional of pending prior application Ser. No. 09/193,279 filed Sep. 17, 1998, and is hereby incorporated by reference in its entirety.

BACKGROUND OF THE INVENTION

The present invention relates to a method and relative device for automatically aligning a workpiece, in particular a pack of printed circuit boards, on a machine tool table.

As is known, a workpiece must be positioned accurately on the worktable of a machine tool, which is achieved by means of locating elements normally provided on the workpiece itself. In the case of packs of printed circuit boards, each pack features a pair of pins projecting from one face of the pack, and which are fitted inside seats on a clamping fixture fitted to the table. The fixture comprises a locating member for clamping one of the pins, and a pair of bars for gripping the other pin.

Machining printed circuits calls for a high degree of precision. For example, each hole drilled on a drilling machine is about 0.5 mm in diameter and must be centered exactly on the respective circuit pad, which may be about 0.6 mm in diameter. As such, the circuit must be positioned up to one micron, and the same degree of precision must be guaranteed over the entire surface of the circuit, which is normally rectangular with sides measuring many centimeters in length.

The positioning precision of the pack clamping fixture depends on how accurately the fixture and the fixture connection to the table are machined, and on how accurately the two pins are fitted to the pack. And, since the drilling position is determined by the machine on the basis of two coordinate axes referred to the table, the coordinate axes of the drilling positions must coincide with those of the table for the pack to be positioned accurately.

Even minor mechanical inaccuracies on the fixture, the fixture connection and/or the pins, may result in linear or angular deviation of the coordinate axes of the pack with respect to those of the table, thus resulting in unacceptably inaccurate drilling. Known fixtures therefore have the drawback, on the one hand, of having to be machined and assembled extremely accurately, and, on the other, of being incapable of correcting inevitable inaccuracies in machining and/or assembly.

SUMMARY OF THE INVENTION

It is an object of the present invention to provide a highly straightforward, reliable method and device for automatically aligning a workpiece on a machine tool, and which provide for eliminating the aforementioned drawbacks typically associated with the known state of the art.

According to the present invention, there is provided a method of automatically aligning a workpiece on a table of a machine tool, wherein the workpiece is fitted to a clamping fixture carried by said table and is machined by a machining head; said head and said table being movable with respect to each other along two coordinate axes; and the method being characterized by comprising the steps of:

providing said workpiece with two locating elements;
fitting said workpiece to said fixture;
determining the distances between the real positions of said locating elements and two corresponding reference positions; and
moving said workpiece on said fixture to eliminate said distances.

According to the present invention, there is also provided a device for automatically aligning the workpiece on the table of the machine tool, wherein the workpiece is fitted to said fixture by means of clamping means movable on said fixture by means of electric motors; control means being provided to so control said motors as to align said workpiece in a predetermined position.

More specifically, the workpiece is defined by a pack of printed circuit boards, and comprises two locating pins which are fitted to said fixture by means of a locating member for one of said pins, and by two bars movable towards each other to grip the other of said pins; said electric motors driving two actuators for moving said locating member along two coordinate X, Y axes, and a third actuator for moving one of said bars along one of said X, Y axes.

The locating member is advantageously carried by a slide traveling along one of said X, Y axes; said slide being guided by a shift member moved along a first surface inclined with respect to said X, Y axes; a first of said bars being moved along a second surface inclined with respect to said X, Y axes; said inclined surfaces producing a component of movement of said locating member and of said first bar along the other of said X, Y axes.

BRIEF DESCRIPTION OF THE DRAWINGS

A preferred embodiment of the invention will be described by way of example with reference to the accompanying drawings, in which:

FIG. 1 shows a view in perspective of a pack of printed circuit boards for machining;

FIG. 2 shows a view in perspective of a multiple-head machine tool featuring the pack aligning device according to the invention;

FIG. 3 shows a schematic partial plan view of a fixture for clamping the pack onto the FIG. 2 machine according to a first variation of the invention;

FIG. 4 shows a schematic, partially sectioned plan view of the FIG. 3 fixture;

FIG. 5 shows a section along line V—V in FIG. 4;

FIG. 9 shows a schematic partial plan view of a fixture for clamping the FIG. 1 pack according to a further variation of the invention;

DETAILED DESCRIPTION OF THE INVENTION

Figure 8:
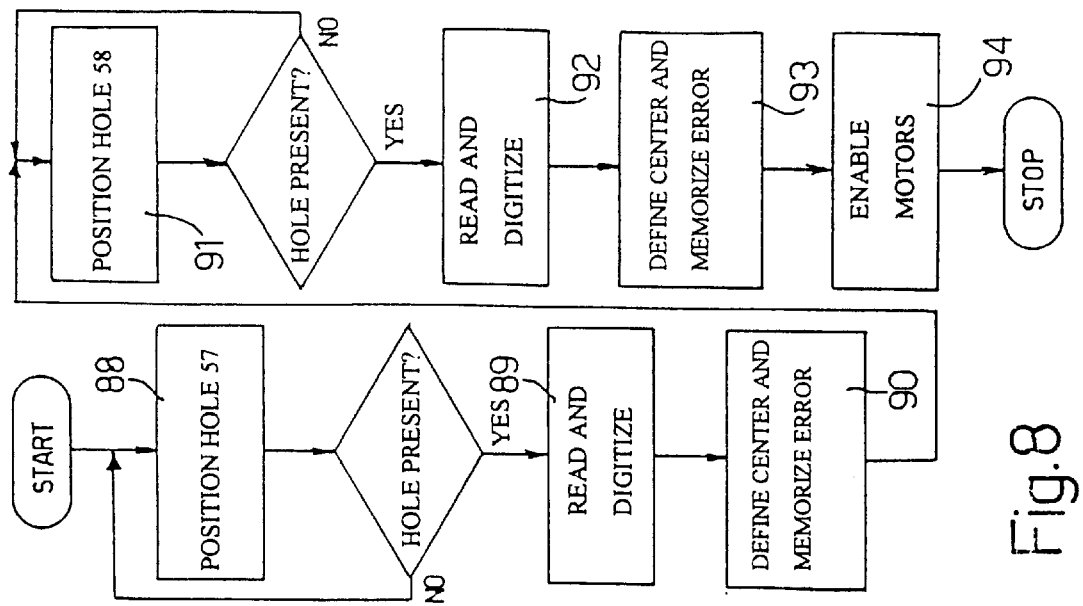
FIG. 8 shows a flow chart illustrating operation of the device.

Number 1 in FIG. 1 indicates as a whole a pack of printed circuit boards 2 as arranged for machining, which normally comprises drilling and milling. Pack 1 is substantially rectangular with a short side m and a long side M, and comprises an auxiliary bottom board 3 and an auxiliary cover board 4.

Boards 2–4 are connected to one another by a pair of cylindrical locating pins 5 and 6, which are located along the center line A of pack 1, at two edges 7 parallel to short side m, and project a given length from the bottom face of auxiliary bottom board 3. As pack 1 may vary in size within certain limits, the distance between pins 5 and 6 varies according to the size of boards 2.

With reference to FIG. 2, number 8 indicates as a whole a machine tool comprising a number of machining heads 9, each having a tool-holder spindle 10; heads 9 are arranged in two rows on a common carriage 11 moved along a coordinate axis X by a numerically controlled servomotor (not shown); machine 8 also comprises a worktable 12 moved along a coordinate axis Y by a further numerically controlled servomotor (not shown); and each spindle 10 is movable vertically along a vertical axis Z, e.g. for drilling, by a third numerically controlled servomotor 15.

Table 12 carries a number of fixtures 13, each for clamping a pack 1 for machining; fixtures 13 are arranged in two rows and associated with machining heads 9; and each fixture 13 (FIG. 3) comprises two straight parallel bars 14 and 16, which are made of extremely hard material, are machined accurately, and are carried by two coplanar plates 17 and 18.

Bars 14 and 16 form a gap 19 in which are inserted pins 5 and 6 of pack 1, which is indicated by the dash line in FIG. 3. In FIGS. 3 and 4, the transverse dimensions of bars 14, 16 and gap 19 are enlarged for the sake of clarity. Plates 17 and 18 are fitted to table 12 in any known manner, and preferably so that bars 14 and 16 extend parallel to the X axis, as shown in FIG. 2.

Plate 17 comprises a locating member defined by a block 21 (FIG. 3) having a V-shaped seat 20 for receiving pin 5. Bar 16 is longer than bar 14, so as to also face block 21, and is movable parallel to itself towards fixed bar 14 and block 21 to clamp pins 5 and 6 of pack 1 onto fixture 13. More specifically, bar 16 is activated by a tubular container 22 made of elastomeric material, and which is deformed by compressed air to so move bar 16 as to clamp pin 5 against seat 20 and pin 6 against bar 14.

According to the invention, block 21 is adjustable on plate 17 in two perpendicular directions. More specifically, block 21 is fitted to plate 17 by means of a plate 23 (see also FIG. 5), two surfaces of which carry a pair of prismatic cross-shaped guides 24 and 25 respectively engaging a groove 26 formed in plate 17 and perpendicular to bar 14, and a groove 27 formed in block 21 and parallel to bar 14. Block 21 carries a nut screw 28 engaging a screw 29 connected to the shaft of a first reversible electric step motor 31 carried on an appendix 32 of plate 23.

Plate 23 comprises a portion 33 having an inclined rib 34 engaging an inclined groove 36 formed in a further block 37; and block 37 comprises a rib 38 engaging a groove 39 formed in plate 17 and parallel to bar 14, and carries a further nut screw 41 engaging a screw 42 connected to the shaft of a second reversible electric step motor 43 carried by an appendix 44 of plate 17.

Bar 14 is adjustable on plate 17 in a direction perpendicular to itself. More specifically, bar 14 is provided underneath with a pair of guides 46 parallel to the Y axis and engaging a corresponding pair of grooves (not shown) formed in plate 17; bar 14 comprises an appendix 47, which in turn is provided underneath with an inclined rib 48 engaging a corresponding inclined groove formed in a block 51; and block 51 carries a nut screw 52 engaging a screw 53 connected to the shaft of a third reversible electric step motor 54 carried by a further appendix 56 of plate 17.

Each pack 1 of boards for drilling is provided with two locating elements defined by two holes 57 and 58 (FIG. 1), which are associated with, and located adjacent to and the same distance from, pins 5 and 6, so that the line joining the centers of holes 57 and 58 is parallel to the center line A of pack 1. Each machining head 9 in the front row (FIG. 2) carries an optoelectronic sensor defined by a television camera 59 for determining the real position of each hole 57, 58 when this is brought within the optical field of the camera.

Figure 6:
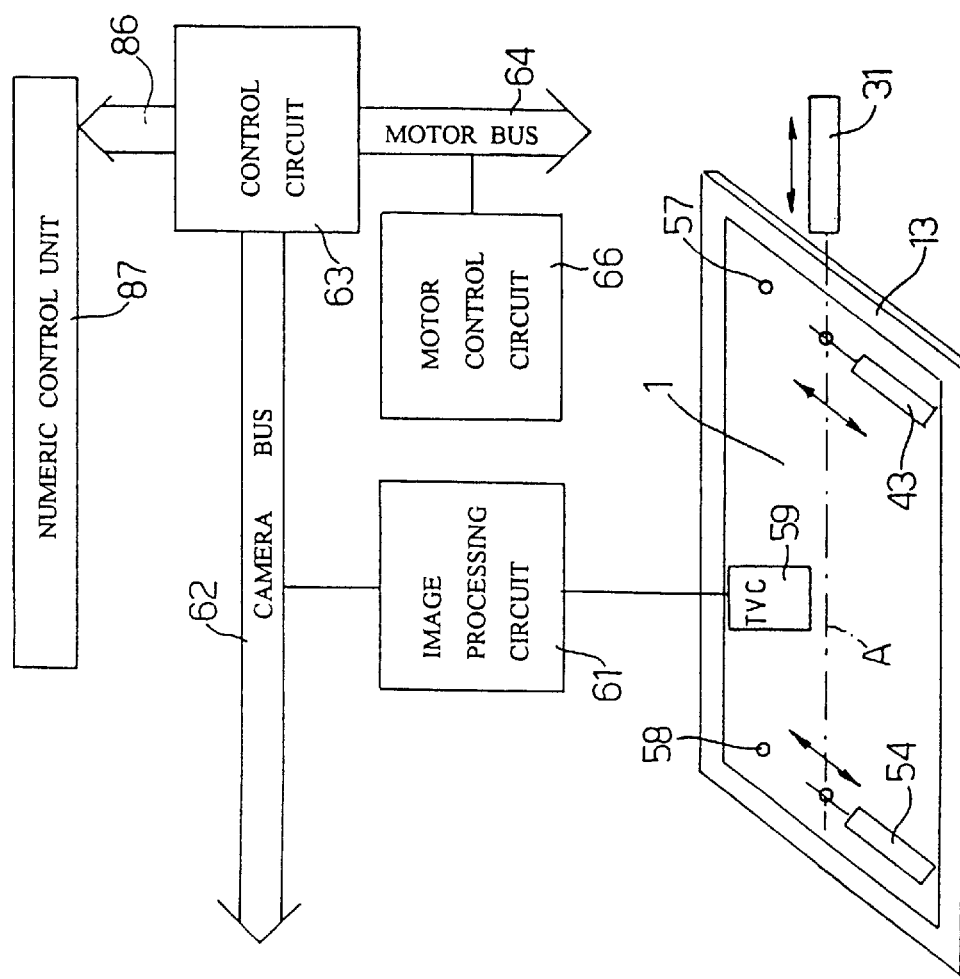
FIG. 6 shows an overall diagram of the device according to the invention.

Each camera 59 is connected to a corresponding image-processing logic circuit 61 (FIG. 6); the four circuits 61 are connected to a camera bus 62 interfacing with a logic control circuit 63 for controlling the device; and control circuit 63 interfaces with a motor bus 64 to which are connected a number of logic control circuits 66, each for controlling the three motors 31, 43, 54 of each fixture 13. In the case of the FIG. 2 machine, only four control circuits 66 are provided.

Figure 7A:
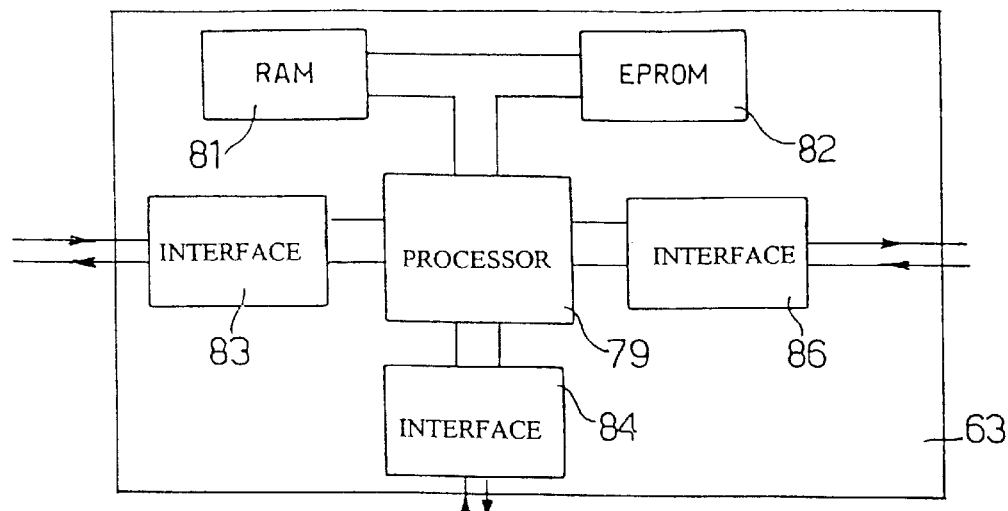
FIGS. 7A–7C shows a block diagram of the logic circuits of the device.
Figure 7B:
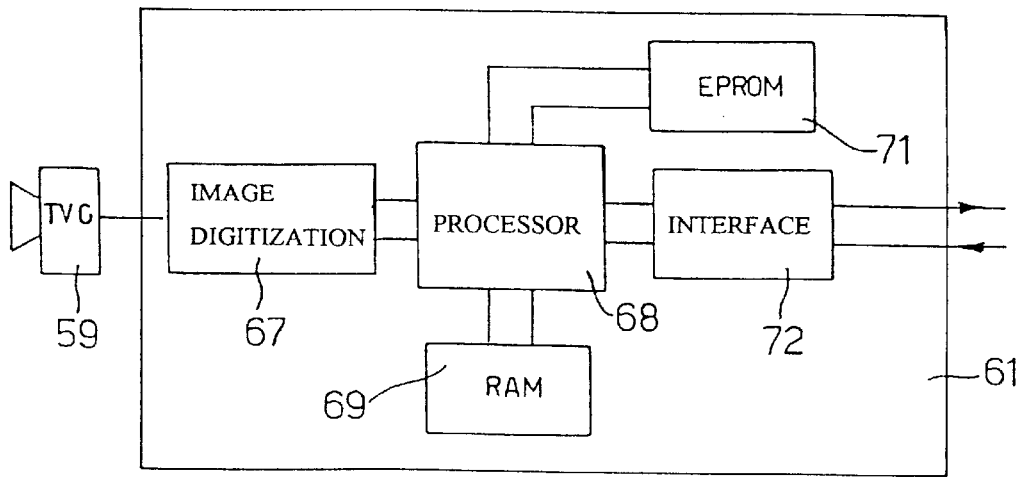
Figure 7C:
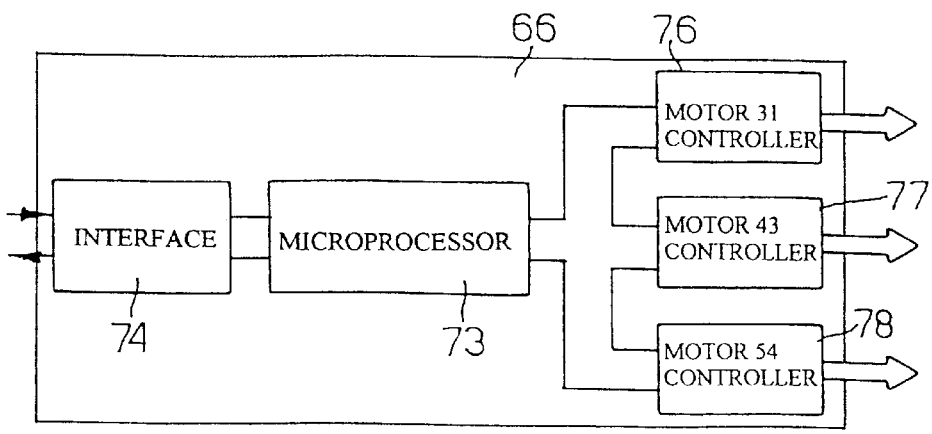
Figure 10A:
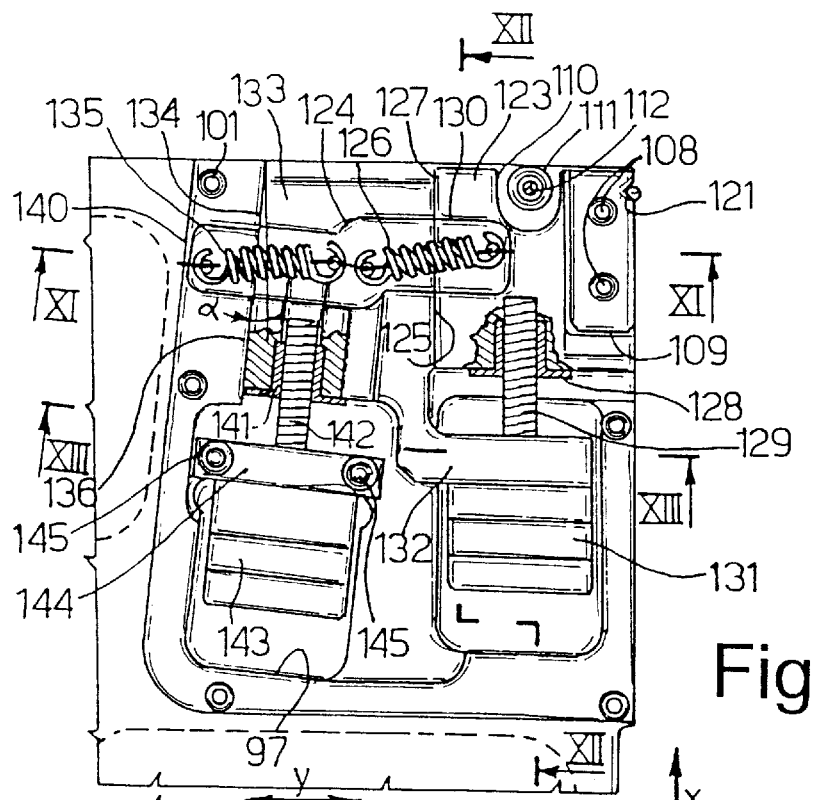
FIGS. 10A–10B shows a partial larger-scale top plan view of a detail in FIG. 9.
Figure 10B:
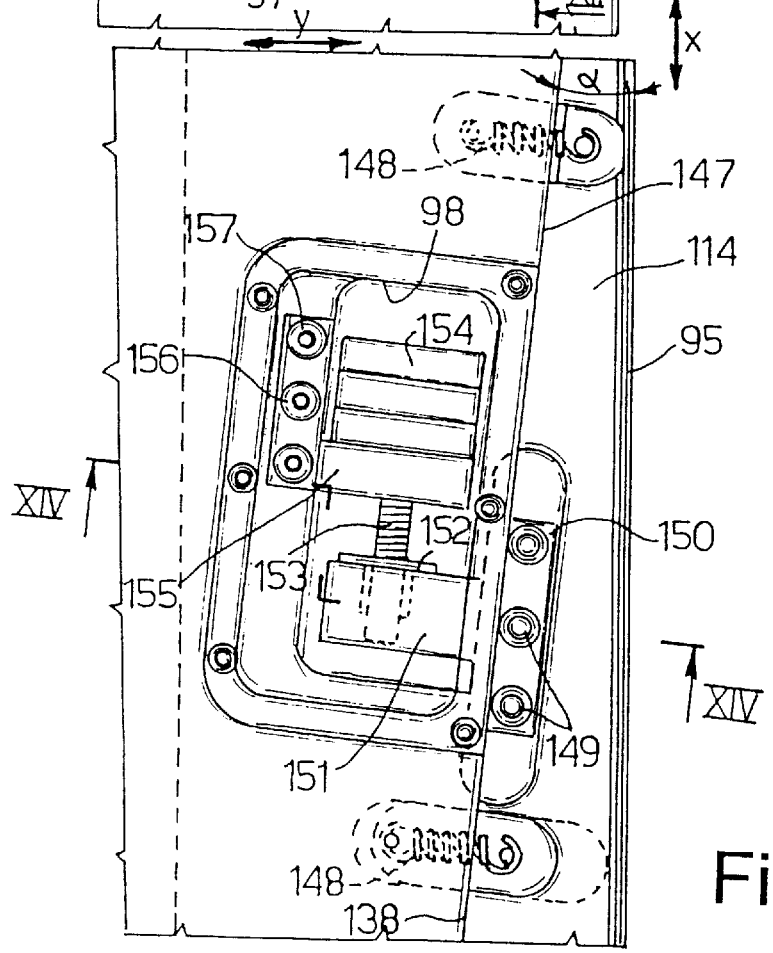
Figure 11:
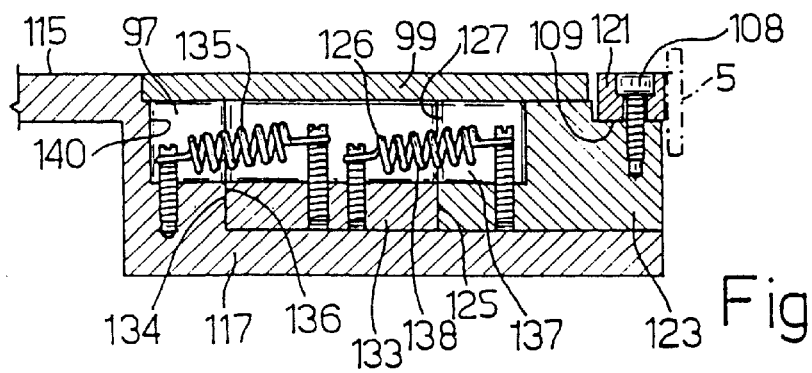
FIG. 11 shows a larger-scale section along line XI—XI in FIG. 10A.
Figure 12:
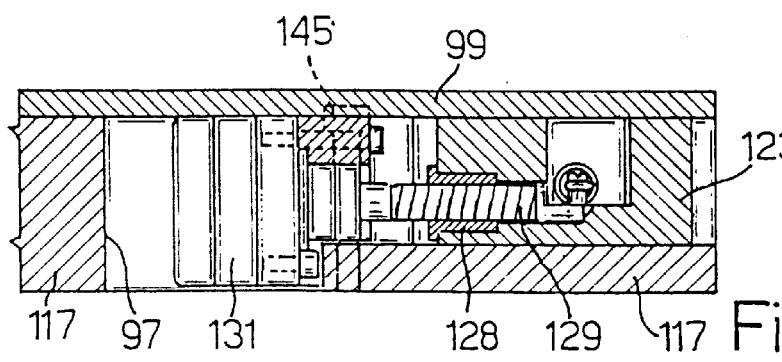
FIG. 12 shows a section, to the FIG. 11 scale, along line XII—XII in FIG. 10.
Figure 13:
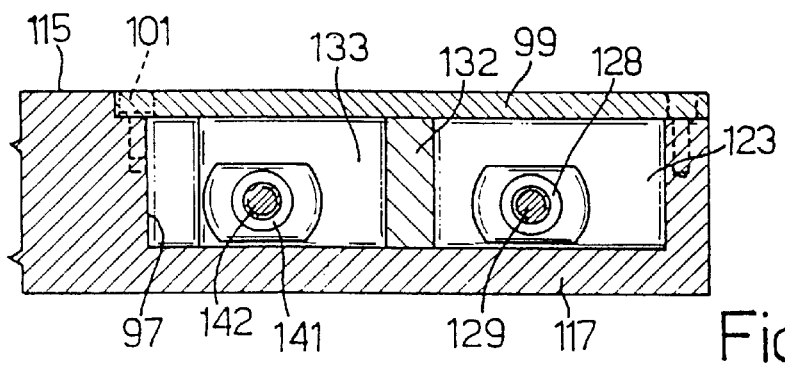
FIG. 13A shows a section along line XIII—XIII in FIG. 10.
Figure 14:
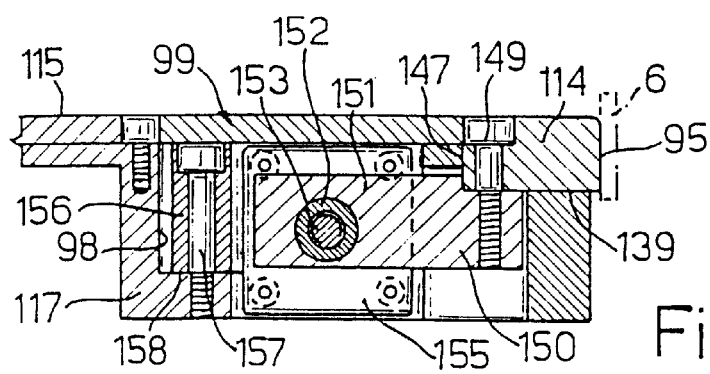
FIG. 14A shows a section along line XIV—XIV in FIG. 10B.

More specifically (FIG. 7), each image-processing circuit 61 comprises an image digitization block 67, which is connected to a processor 68 connected to a RAM memory 69 and controlled by a program recorded in an EPROM memory 71; circuit 61 also comprises a serial interface 72 for connection to bus 62 (see also FIG. 6); and block 67, controlled by processor 68, determines the presence of hole 57, 58, and receives and converts the read data from camera 59 into numeric data.

On the basis of the numeric data, processor 68 determines the center of the sensed hole 57, 58 and the dimensions of the real hole position along the X and Y axes; and, by comparison with the reference hole position represented by the position of table 12 and that of carriage 11, the components of the distance between the real hole position and the reference position are determined and recorded in RAM 69.

Control circuit 66 comprises a microprocessor 73 connected to bus 64 via a serial interface 74, and a set of three known controllers 76, 77, 78 for driving respective motors 31, 43, 54; control circuit 63 comprises a processor 79 connected to a RAM memory 81 and controlled by a program recorded in an EPROM memory 82; and circuit 63 comprises an interface 83 for connection to bus 62, an interface 84 for connection to bus 64, and an interface 86 for connection to a numeric control unit 87 of the machine.

Operation of the pack 1 aligning device will now be described with reference to the flow chart in FIG. 8.

Packs 1 (FIG. 1) complete with holes 57 and 58 are first placed on fixtures 13 (FIG. 2) and compressed air is fed into containers 22 so that each pack 1 is clamped by bar 16 with pin 5 inside V-shaped seat 20 of block 21 and with pin 6 clamped against bar 14. Numeric control unit 87 (FIGS. 2 and 6) then moves table 12 along the Y axis to bring holes 57, 58 of packs 1 in the front row of fixtures 13 into the plane of cameras 59, and moves carriage 11 along the X axis to align each camera 59 vertically with the desired or reference position of the respective hole 57 adjacent to pin 5 (operation 88 in FIG. 8).

Unit 87 then enables control-circuit 63 to control the aligning operation. Circuit 63 first enables circuits 61 sequentially to receive and digitize the signals read by cameras 59 (operation 89) and to define and memorize in each RAM 69 the error components along the X and Y axes, i.e. the components of the distance between the real position of hole 57 and the reference position (operation 90).

Unit 87 then moves carriage 11 along the X axis to align cameras 59 with holes 58 adjacent to pins 6 (operation 91); and control circuit 63 again enables circuits 61 to receive the signals read by cameras 59 (operation 92) and to record in respective RAM 69 the Y-axis component of the distance between the real position of hole 58 and the respective reference position (operation 93).

Finally, control circuit 63 enables processing circuits 61 sequentially to transfer the recorded X- and Y-axis components of hole 57 and the Y-axis component of hole 58 to respective control circuits 66, which are then enabled to each control the three motors 31, 43, 54 of respective fixture 13 in the front row.

On each of the front-row fixtures 13, motor 43, by means of block 37 (see also FIG. 4), moves plate 23 according to the Y-axis component of hole 57 determined by respective circuit 61; motor 31 moves block 21 according to the respective X-axis component; and, at the same time, motor 54 moves bar 14 according to the Y-axis component of hole 58.

The centers of the two holes 57 and 58 of each pack 1 are thus perfectly aligned with the respective reference positions (operation 94). Needless to say, the movements effected by motors 31, 43, 54 are normally extremely small to simply correct any positioning errors due to inevitable mechanical tolerances of the component parts.

Unit 87 then moves table 12 to align holes 57, 58 of packs 1 in the rear row of fixtures 13 with cameras 59 of heads 9 in the front row; machine 8 and circuits 61 are then operated by unit 87 and circuit 63 to perform operations 88–93 in FIG. 8; and, finally, control circuit 63 enables control circuits 66 to operate motors 31, 43, 54 of rear-row fixtures 13 to perform operation 94. The aligning device therefore provides for alternately aligning packs 1 in the two rows of fixtures 13.

FIGS. 9–14 show a pack 1 clamping and aligning fixture 113 according to a variation of the invention, and which comprises two coplanar plates 117 and 118, each having a top surface 115 for supporting pack 1. Fixture 113 also comprises two bars 114 and 116 carried by plates 117 and 118 and having two opposite straight parallel surfaces 95 and 96.

Bars 114 and 116 are made of extremely hard material, are machined accurately, and have respective top surfaces flush with the top surfaces 115 of plates 117 and 118; surfaces 95 and 96 define a gap 119 in which is inserted pin 6 of pack 1, which is indicated by the dash line in FIG. 9; and plates 117 and 118 are fitted to the table so that surfaces 95 and 96 of bars 114 and 116 are parallel to the X axis.

Plate 117 comprises a locating member defined by a block 121 having a V-shaped seat 120 for receiving pin 5. Bar 116 is longer than bar 114, so as to also face block 121, and is movable parallel to itself towards fixed bar 114 and block 121 to clamp pins 5 and 6 of pack 1 onto fixture 113.

More specifically, bar 116 is activated by a tubular container 122 made of elastomeric material, and which is deformed by compressed air to move bar 116 as to clamp pin 5 against seat 120 and pin 6 against bar 114. Both block 121 and bar 114 are fitted adjustably to plate 117. For which purpose, plate 117 comprises two cavities 97 and 98 accessible from the top, and each of which is closed by a respective plate 99, 100 fitted removably to plate 117 by means of screws 101.

Block 121 is movable inside cavity 97 (FIG. 10) in two perpendicular directions. More specifically, block 121 is fitted by means of screws 108 inside a cavity 109 (see also FIG. 11) of a substantially parallelepiped slide 123, which comprises a cavity 110 housing a pin 111 for fastening plate 99 by means of a further screw 112.

Slide 123 comprises a flat wall 127 parallel to the X axis and therefore to surface 95, and which, by means of a return spring 126, rests against a wall 125 also parallel to surface 95. Wall 125 is carried by a prismatic, trapezoidal-section, intermediate shift member 133, a wall 134 of which, opposite wall 125, is inclined with respect to wall 125 by a given angle α and, by means of a second return spring 135, rests against a vertical wall 136 of cavity 97. Springs 126 and 135 are housed in three cavities 124, 130 and 140 respectively formed in slide 123, in intermediate member 133 and in wall 136 of cavity 97.

Wall 136 forms a first inclined surface sloping with respect to coordinate axes X, Y, provides for guiding the movement of member 133, and is so inclined that the movement of intermediate member 133 along wall 136 itself produces a given component of movement of block 121 along the Y axis. More specifically, wall 136 and the X axis form said angle α, which may range between 5° and 10°.

Slide 123 carries a nut screw 128 (see also FIG. 12) engaging a screw 129, which is connected to the shaft of a first reversible electric motor 131 carried by an appendix 132 of intermediate member 133. Screw 129 and the shaft of motor 131 are parallel to the X axis. Intermediate member 133 carries another nut screw 141 engaging a screw 142 (see also FIG. 13) connected to the shaft of a second reversible electric motor 143, which is carried by a block 144 fitted to plate 117 by means of two screws 145. Screw 142 and the shaft of motor 143 are parallel to the top surface 115 of plate 117 and to wall 136 of cavity 97.

Bar 114 comprises a wall 147 opposite surface 95 and forming with surface 95 a predetermined angle, which may advantageously be equal to angle α. Bar 114 is housed in a depression 139 on plate 117 (see also FIG. 14), and depression 139 has a vertical guide wall 138 forming a second inclined surface at angle α with respect to the X axis. Wall 147 of bar 114 rests against inclined wall 138 by means of three return springs 148 (see also FIG. 9), which are inclined with respect to surface 115 of plate 117 so as to create a downward component to keep bar 114 resting against depression 139 in plate 117.

Bar 114 is fitted by means of screws 149 with an appendix 151 of a block 150; appendix 151 is fitted with a nut screw 152 engaging a screw 153 connected to the shaft of a further reversible electric motor 154 carried by a support 155; an appendix 156 of support 155 is fitted by means of screws 157 to a shoulder 158 of cavity 98; and screw 153 and the shaft of motor 154 are parallel to top surface 115 of plate 117 and to wall 138 of depression 139.

The FIGS. 9–14 device for aligning pack 1 of boards 2 operates as follows.

The three electric motors 131, 143, 154 are controlled by circuit 66 in the same way as motors 31, 43, 54 in FIG. 4. Pack 1 of boards 2 (FIG. 1) complete with holes 57 and 58 is first placed on fixture 113 (FIG. 9) and compressed air is fed into container 122 so that pack 1 is clamped by surface 96 of bar 116 with pin 5 inside V-shaped seat 120 of block 121 and with pin 6 clamped against surface 95 of bar 114, as on the FIG. 4 fixture.

Numeric control unit 87 (FIG. 6) then moves table 12 (FIG. 2) along the Y axis and carriage 11 of machining heads 9 along the X axis to align holes 57, 58 of pack 1 with respective optoelectronic sensor 59 and memorize the error components along the X and Y axes, i.e. the components of the distance between the real position of holes 57, 58 and the reference position, in the same way as before.

Finally, the recorded X- and Y-axis components of hole 57 and the Y-axis component of hole 58 are transferred to control circuit 66, which is then enabled to control the three motors 131, 143, 154 (FIG. 10) of fixture 113. Motor 143 moves intermediate member 133 parallel to inclined wall 136 of cavity 97 to produce a component of movement of member 133 and of block 121 according to the recorded Y-axis component of hole 57.

In turn, motor 131 moves slide 123 and block 121 parallel to the X axis to produce a resultant movement of block 121 equal to the respective recorded X-axis component of hole 57. At the same time, motor 154 moves bar 114 parallel to inclined wall 138 of depression 139 to produce a component of movement of bar 114 according to the recorded Y-axis component of hole 58, so that the centers of the two holes 57 and 58 of pack 1 are aligned perfectly with the respective reference positions.

The method of aligning a workpiece or pack 1 on respective fixture 13, 113 (FIGS. 4 and 10) therefore comprises the steps of providing pack 1 with two locating elements 57, 58; fixing pack 1 to fixture 13, 113; determining the distances between the real positions of locating elements 57, 58 and two predetermined reference positions; and shifting pack 1 on fixture 13, 113 to eliminate said distances. Needless to say, the movements effected by motors 31, 43, 54 or 131, 143, 154 are normally extremely small to simply correct any positioning errors due to inevitable mechanical tolerances of the component parts.

The advantages, as compared with the known state of the art, of the pack 1 aligning device will be clear from the foregoing description. In particular, fixture 13, 113 and/or pins 5, 6 may be formed less accurately, thus reducing production cost. Moreover, any mechanical inaccuracy of fixture 13, 113 and/or pins 5, 6 of packs 1 may be easily corrected, thus eliminating rejects. And finally, in the FIG. 10 variation, springs 126, 135 and 148 provide for dispensing with prismatic guides for block 121 and bar 114.

Clearly, changes may be made to the method and device as described herein without, however, departing from the scope of the accompanying Claims. For example, in the case illustrated, motors 31, 43, 54 or 131, 143, 154 of each fixture 13 or 113 may be controlled by a corresponding control circuit 66, so that the two groups of circuits 66 are enabled alternately to receive the data memorized by circuits 61.

Machine tool 8 may feature only one row of machining heads 9 and one row of fixtures 13, 113, in which case, only one aligning cycle is sufficient. The fixture 13, 113 may be applied to a machine tool having only one machining head and/or a table carrying one or more pack fixtures; and fixture 13, 113 may be oriented with gap 19, 119 parallel to the Y axis.

Bar 16, 116 of fixture 13, 113 may be moved by a mechanism, as opposed to tubular container 22, 122; pin 5 may be clamped to block 21, 121 by a separate mechanism; one or more of motors 31, 43, 54, 131, 143, 154 may be replaced by linear actuators of any type; the means for transmitting motion to block 21, 121 and to bar 14, 114 may differ from those described; and, finally, the aligning device may be used for aligning any type of workpiece on a machine tool.

What is claimed is:

1. A method of automatically aligning a workpiece on a table of a machine tool, wherein the workpiece (1) is fitted to a clamping fixture (13, 113) carried by said table (12) and is machined by a machining head (9); said head (9) and said table (12) being movable with respect to each other along two coordinate axes X, Y; and the method being characterized by comprising the steps of:

providing said workpiece (1) with two locating elements (57, 58);

fitting said workpiece (1) to said fixture (13, 113);

determining the distances between the real positions of said locating elements (57, 58) and two corresponding reference positions (90, 93); and moving said workpiece (1) on said fixture (13, 113) to eliminate said distances (94).

2. A method as claimed in claim 1, wherein said workpiece is defined by a pack (1) of printed circuit boards, the pack having two locating pins (5, 6) which are clamped on said fixture (13, 113); characterized in that said two locating elements are defined by two holes (57, 58) which are sensed by an optoelectronic sensor (59) located on said head (9).

3. A method as claimed in claim 2, characterized in that said step (90, 93) of determining said real positions and said distances comprises determining the positions of the centers of said holes (57, 58) and the components of said distances along said coordinate axes X, Y.

4. A method as claimed in claim 3, wherein said fixture (13) comprises a locating member (21, 121) for a first of said pins (5, 6), and two bars (14, 16; 114, 116) parallel to a first of said coordinate axes X, Y; said bars (14, 16; 114, 116) being movable with respect to each other to clamp the other of said pins (5, 6); characterized in that said holes (57, 58) are adjacent to and a predetermined distance from said pins (5, 6).

5. A method as claimed in claim 4, characterized in that said step (94) of moving said pack (1) comprises moving said locating member (21, 121) along said coordinate axes X, Y according to the respective distance components of the hole (57) adjacent to said first pin (5); and moving one of said bars (14, 16; 114, 116) parallel to itself along one of said coordinate axes X, Y according to the respective distance component of the other (58) of said holes (57, 58).

6. A method as claimed in claim 2, wherein said machine tool (8) comprises a number of machining heads (9), and said table (12) comprises a corresponding number of fixtures (13, 113); characterized in that said step (90, 93) of determining the distances and said step (94) of moving the packs (1) are performed simultaneously on packs (1) fitted to said fixtures (13, 113).

7. A method as claimed in claim 6, wherein said heads (9) are arranged in two rows; said fixtures (13, 113) being arranged in two corresponding rows; characterized in that the heads (9) in one of said rows comprise said sensors (59); said step (90, 93) of determining the distances and said step (94) of moving the packs (1) being performed alternately for said two rows of fixtures (13, 113).

* * * * *

UNITED STATES PATENT AND TRADEMARK OFFICE
CERTIFICATE OF CORRECTION

PATENT NO. : 6,283,681 B1
DATED : September 4, 2001
INVENTOR(S) : Angelo Raiteri It is certified that error appears in the above-identified patent and that said Letters Patent is hereby corrected as shown below:

<u>Title page,</u>
Item [62], please delete the existing related application paragraph and replace it with the following:
-- Division of application No. 09/193,279, filed on November 17, 1998, now Pat. No. 6,109,840. --

Signed and Sealed this

Seventeenth Day of December, 2002

JAMES E. ROGAN
*Director of the United States Patent and Trademark Office*

UNITED STATES PATENT AND TRADEMARK OFFICE
CERTIFICATE OF CORRECTION

PATENT NO. : 6,283,681 B1 Page 1 of 1
DATED : September 4, 2001
INVENTOR(S) : Angelo Raiteri It is certified that error appears in the above-identified patent and that said Letters Patent is hereby corrected as shown below:

<u>Title page,</u>
Item [73], Assignee, please add Assignee information as follows:
-- [73] Assignee: Borgotec Technologie per l'Automazione S.p.A., Borgomanero, Italy --.

Signed and Sealed this

Twenty-fifth Day of March, 2003

JAMES E. ROGAN
*Director of the United States Patent and Trademark Office*